United States Patent
Koyama et al.

(10) Patent No.: US 10,153,326 B2
(45) Date of Patent: Dec. 11, 2018

(54) MEMORY DEVICE

(71) Applicant: Toshiba Memory Corporation, Minato-ku (JP)

(72) Inventors: Masato Koyama, Yokkaichi (JP); Harumi Seki, Yokkaichi (JP); Shosuke Fujii, Kuwana (JP); Hidenori Miyagawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/958,309

(22) Filed: Dec. 3, 2015

(65) Prior Publication Data
US 2016/0276412 A1    Sep. 22, 2016

(30) Foreign Application Priority Data
Mar. 19, 2015  (JP) .................. 2015-056251

(51) Int. Cl.
*H01L 45/00* (2006.01)
*H01L 27/24* (2006.01)

(52) U.S. Cl.
CPC ........ *H01L 27/2481* (2013.01); *H01L 45/085* (2013.01); *H01L 45/1233* (2013.01); *H01L 45/145* (2013.01); *H01L 45/146* (2013.01)

(58) Field of Classification Search
CPC ................. H01L 27/2463; H01L 45/146
See application file for complete search history.

(56) References Cited

U.S. PATENT DOCUMENTS

| | | | |
|---|---|---|---|
| 9,142,774 B2* | 9/2015 | Yabuhara | H01L 45/12 |
| 9,305,646 B2* | 4/2016 | Ichihara | G11C 13/0069 |
| 2006/0050598 A1 | 3/2006 | Rinerson et al. | |
| 2008/0220601 A1* | 9/2008 | Kumar | H01L 45/145 438/585 |
| 2009/0014707 A1 | 1/2009 | Lu et al. | |
| 2013/0250656 A1* | 9/2013 | Ishikawa | H01L 45/04 365/148 |

(Continued)

FOREIGN PATENT DOCUMENTS

| | | |
|---|---|---|
| JP | 2012-199441 A | 10/2012 |
| JP | 2012-238893 | 12/2012 |

(Continued)

OTHER PUBLICATIONS

WIPO machine translation of WO 2013/137262.*

(Continued)

*Primary Examiner* — Benjamin Sandvik
(74) *Attorney, Agent, or Firm* — Oblon, McClelland, Maier & Neustadt, L.L.P.

(57) ABSTRACT

According to one embodiment, a memory device includes a first conductive layer, a second conductive layer, a first insulating layer and a first layer. The first conductive layer includes a first metal capable of forming a compound with silicon. The second conductive layer includes at least one selected from a group consisting of tungsten, molybdenum, platinum, tungsten nitride, molybdenum nitride, and titanium nitride. The first insulating layer is provided between the first conductive layer and the second conductive layer. The first layer is provided between the first insulating layer and the second conductive layer. The first layer includes silicon.

22 Claims, 6 Drawing Sheets

(56) References Cited

U.S. PATENT DOCUMENTS

| | | |
|---|---|---|
| 2013/0256622 A1 | 10/2013 | Sei et al. |
| 2014/0070161 A1 | 3/2014 | Sugimae et al. |
| 2014/0133210 A1 | 5/2014 | Ichihara et al. |
| 2014/0284543 A1* | 9/2014 | Ishikawa ............... H01L 45/148 257/4 |
| 2014/0319442 A1* | 10/2014 | Hayashi ................ H01L 45/12 257/2 |
| 2014/0353566 A1* | 12/2014 | Wang .................... H01L 45/146 257/2 |
| 2015/0083987 A1* | 3/2015 | Kakushima ............ H01L 45/08 257/4 |
| 2015/0255513 A1* | 9/2015 | Nakakubo ........... H01L 27/2481 365/148 |

FOREIGN PATENT DOCUMENTS

| | | |
|---|---|---|
| JP | 2013-162086 A | 8/2013 |
| JP | 2013-197420 | 9/2013 |
| JP | 2013-200923 A | 10/2013 |
| JP | 2013-211411 | 10/2013 |
| JP | 2014-53522 | 3/2014 |
| JP | 2014-99557 | 5/2014 |
| WO | WO 2013/137262 * | 9/2013 |

OTHER PUBLICATIONS

Mark Johnson, et al., "512-Mb PROM With a Three-Dimensional Array of Diode/Antifuse Memory Cells", IEEE Journal of Solid-State Circuits, vol. 38, (11), 2003, 9 pgs.

X.P. Wang, et al., "Highly Compact 1T-1R Architecture ($4F^2$ Footprint) Involving Fully CMOS Compatible Vertical GAA Nano-Pillar Transistors and Oxide-Based RRAM Cells Exhibiting Excellent NVM Properties and Ultra-Low Power Operation" IEDM12-493, IEEE, 2012, 4 pages.

* cited by examiner

MEMORY DEVICE

CROSS-REFERENCE TO RELATED APPLICATIONS

This application is based upon and claims the benefit of priority from Japanese Patent Application No. 2015-056251, filed on Mar. 19, 2015; the entire contents of which are incorporated herein by reference.

FIELD

Embodiments described herein relate generally to a memory device.

BACKGROUND

One type of memory device is a cross-point resistive random access memory. Reduced power consumption is desired in such memory devices.

DETAILED DESCRIPTION

Figure 1:
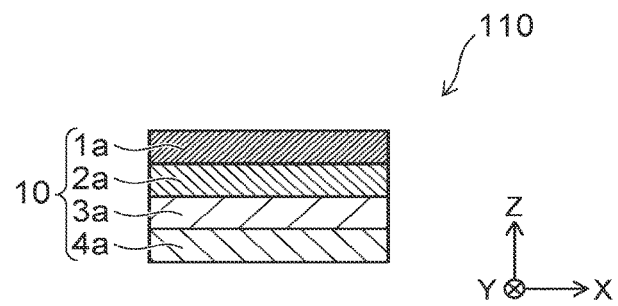
FIG. 1 is a schematic cross-sectional view showing a memory device according to a first embodiment.

According to one embodiment, a memory device includes a first conductive layer, a second conductive layer, a first insulating layer and a first layer. The first conductive layer includes a first metal capable of forming a compound with silicon. The second conductive layer includes at least one selected from a group consisting of tungsten, molybdenum, platinum, tungsten nitride, molybdenum nitride, titanium nitride, tantalum and tantalum nitride. The first insulating layer is provided between the first conductive layer and the second conductive layer. The first layer is provided between the first insulating layer and the second conductive layer. The first layer includes silicon.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

FIG. 1 is a schematic cross-sectional view illustrating a memory device according to a first embodiment.

As illustrated in FIG. 1, a memory device 110 according to this embodiment includes a stacked body 10. The stacked body 10 includes a first conductive layer 1a, a first insulating layer 2a, a first silicon-including layer 3a (a first layer), and a second conductive layer 4a. The memory device 110 is a non-volatile memory device, for example.

In the description below, the stacking direction from the second conductive layer 4a toward the first conductive layer 1a is defined as the Z-axis direction. One direction orthogonal to the Z-axis direction is defined as the X-axis direction. The direction orthogonal to the X-axis direction and the Z-axis direction is defined as the Y-axis direction.

A readily ionized metal is used in the first conductive layer 1a. For example, the first conductive layer 1a includes a first metal capable of forming a compound with silicon. The first metal includes at least one selected from the group consisting of nickel (Ni), cobalt (Co), and titanium (Ti).

The first conductive layer 1a may also include, for example, a compound of the first metal with silicon (a metal silicide). This is because a metal silicide has higher chemical stability as well as better structural flatness than a pure metal, and lends itself toward device integration. The metal silicide preferably has a metal-rich composition ratio. This results in the first metal being readily ionized.

The first insulating layer 2a is provided between the first conductive layer 1a and the second conductive layer 4a. The first insulating layer 2a comes into contact with and is electrically connected to the first conductive layer 1a. The first insulating layer 2a is made of, for example, an insulative substance. Specifically, the first insulating layer 2a includes at least one selected from a group consisting of a hafnium oxide, a zirconium oxide, a titanium oxide, and a combination thereof.

Conductive filaments made of the first metal can be formed in these metal oxides by applying electrical stimulation to the stacked body 10. These metal oxides have the properties that conductive filaments formed therein automatically decompose and disappear by thermal stimulation when electrical stimulation is eliminated.

The first silicon-including layer 3a is provided between the first insulating layer 2a and the second conductive layer 4a. The first silicon-including layer 3a comes into contact with and is electrically connected to the first insulating layer 2a. The first silicon-including layer 3a includes silicon in at least a portion thereof. The first silicon-including layer 3a includes, for example, at least one selected from a group consisting of silicon, a silicon oxide, a silicon nitride and a silicon oxynitride.

A conductive filament made of the first metal can be formed in the first silicon-including layer 3a by applying electrical stimulation to the stacked body 10. This conductive filament is capable of stably maintaining its structure even after electrical stimulation is eliminated. This is due to that the metal such as Ni, Co, or Ti that constitutes the first metal has the properties of readily forming covalent bonds with Si atoms included in the first silicon-including layer 3a. The metal such as Ni, Co, or Ti and Si donate the electrons to each other to form a hybrid orbital. For this reason, a strong conductive filament not easily destroyed by thermal stimulation is formed.

The second conductive layer 4a comes into contact with and is electrically connected to the first silicon-including layer 3a. The second conductive layer 4a is made of a chemically inert conductive material that is less apt to be ionized than the first metal. For example, the conductive material (first material) used in the second conductive layer 4a includes at least one selected from a group consisting of tungsten (W), molybdenum (Mo), platinum (Pt), tungsten nitride, molybdenum nitride, titanium nitride, tantalum (Ta), and tantalum nitride. The metal atoms that constitute these conductive materials are not readily ionized by electrical stimulation.

The operation of the memory device according to the embodiment will be described below.

The stacked body 10 of the memory device 110 is utilized as the smallest unit of the memory device. This smallest unit includes two memory states: a high-resistance state and a low-resistance state.

Figure 2:
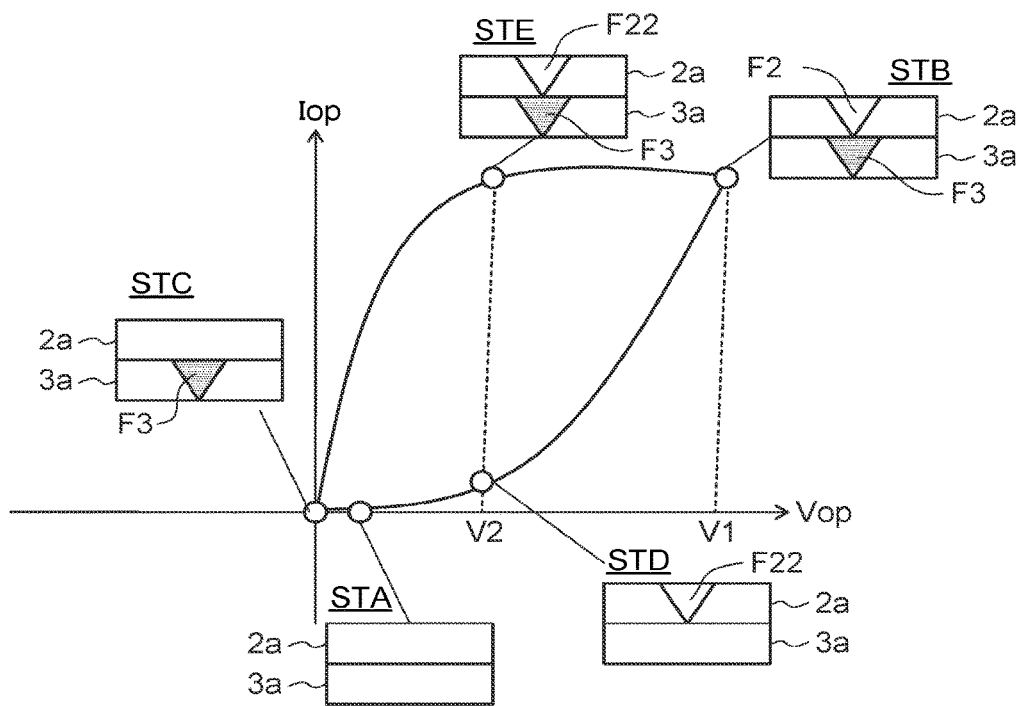
FIG. 2 is a schematic view showing the operation of the memory device according to the embodiment.

FIG. 2 is a schematic view illustrating the operation of the memory device according to the embodiment.

The horizontal axis in FIG. 2 represents the operating voltage Vop applied to the stacked body 10 (between the first conductive layer 1s and the second conductive layer 4a). The vertical axis in FIG. 2 represents the operating current Iop that flows in the stacked body 10. In the initial state, the stacked body 10 is in the high-resistance state (state STA of FIG. 2).

First, an example of the write operation in the memory device 110 will be described with reference to FIG. 2.

In the write operation, a voltage V1 (first voltage) that is positive relative to the second conductive layer 4a is applied to the first conductive layer 1a. Accordingly, the atoms of the first metal such as Ni included in the first conductive layer 1a are ionized. The ionized atoms are transported into the first insulating layer 2a and the first silicon-including layer 3a by an electric field that arises in the stacked body 10. The transported ions are reduced in the respective first insulating layer 2a and first silicon-including layer 3a to form conductive filaments (state STB of FIG. 2). For example, a conductive filament F2 is formed in the first insulating layer 2a, and a conductive filament F3 is formed in the first silicon-including layer 3a. As a result, the electrical resistance of the stacked body 10 (between the second conductive layer 4a and the first conductive layer 1a) transitions from the high-resistance state to the low-resistance state.

When this electrical stimulation (that is, voltage V1) is eliminated, the conductive filament F2 made of the first metal (Ni or the like) in the first insulating layer 2a is, for example, automatically decomposed by thermal stimulation (for example, atomic vibration occurring at a finite temperature). On the other hand, the conductive filament F3 made of the first metal in the first silicon-including layer 3a is not decomposed by heat even when electrical stimulation is eliminated due to strong chemical bonds between the first metal and Si. The state in which the conductive filament F3 is formed is maintained for an extremely long time. This is equivalent to the low-resistance state in the memory device 110 (state STC of FIG. 2). This application of voltage is called the memory write operation.

As will be described later, this low-resistance state is detected as a low-resistance state during the read operation of the memory device. On the other hand, when the read operation is not being performed, the resistance of the stacked body 10 is extremely high.

In the memory device in the low-resistance state (state STC), when a voltage that is negative relative to the second conductive layer 4a is applied to the first conductive layer 1a, the structure of the conductive filament F3 formed in the first silicon-including layer 3a is substantially unaffected by the voltage. Thus, the memory device 110 can be utilized as, for example, a one-time memory. A one-time memory is used in applications in which the user writes information only one time and keeps the information for a long period without overwriting the information.

Next, an example of the read operation in the memory device 110 will be described.

In the read operation, a voltage V2 (second voltage) that is positive relative to the second conductive layer 4a is applied to the first conductive layer 1a in order to read out the memory state of the stacked body 10 to an external circuit. The voltage V2 is lower than the voltage V1. When such a voltage V2 is applied, a conductive filament F22 made of the first metal is formed in the first insulating layer 2a. Then, the electrical resistance between the second conductive layer 4a and the first conductive layer 1a is detected.

When the stacked body 10 is in the high-resistance state (state STA), the high-resistance state of the first silicon-including layer 3a (state STD of FIG. 2) is read by applying the voltage V2.

When the stacked body 10 is in the low-resistance state (state STC), the low-resistance state, in which the filament F3 made of Ni or the like formed in the first silicon-including layer 3a has been formed (state STE of FIG. 2), is read.

When the voltage V2 is eliminated, the conductive filament F22 made of Ni or the like in the first insulating layer 2a is destroyed by thermal stimulation, and the original memory state is maintained.

The memory device 110 of FIG. 1 can be utilized in a cross-point memory cell array (FIG. 9) to be described later. In a cross-point memory cell array, the stacked body 10 of FIG. 1 corresponds to one memory cell, and a plurality of stacked bodies 10 are arranged in an array. When the write operation, the read operation, or the like is performed on a cell of interest, the polarity and absolute value of the voltage applied to cells other than the cell of interest are regulated. This can suppress conductive filaments made of Ni or the like from being generated in the first insulating layers 2a of cells other than the cell of interest. Therefore, the current that flows (leaks) to cells other than the cell of interest can be reduced.

In the memory device 110, the formation and disappearance of a metal filament of Ni or the like serve as a memory operation mechanism. For this reason, the memory device 110 can be driven with markedly lower power consumption than the conventional antifuse style.

The stacked body 10 is a two-terminal memory, and a plurality of stacked bodies 10 may be stacked three-dimensionally. As a result, the memory capacity per chip in a memory device can be enormously increased.

Ni, Co, or Ti is suitable for the material of the first conductive layer 1a. A one-time memory requires that the storage state be maintained for a long period. As described above, the chemical bonding force between each of these materials and the silicon included in the first silicon-including layer 3a is extremely strong. For this reason, it is possible to maintain a certain low-resistance state for a long period by using these materials.

It is possible to form a conductive filament in the first silicon-including layer 3a even when, for example, gold (Au) is used as the material of the first conductive layer 1a.

However, Au does not form a strong chemical bond with silicon. For this reason, this conductive filament is easily decomposed and it cannot meet the specifications required for a one-time memory.

A memory state can be maintained for a long period by using Ti as the material of the first conductive layer 1a. This is because the chemical bond between Ti and Si is more stable than the chemical bond between Ni and Si or the chemical bond between Co and Si.

However, when Ti is used in the first conductive layer 1a, the voltage when transitioning from the high-resistance state (state STA) to the low-resistance state (state STB) (transition voltage Vs) is higher than when Ni or Co is used.

Figure 3:
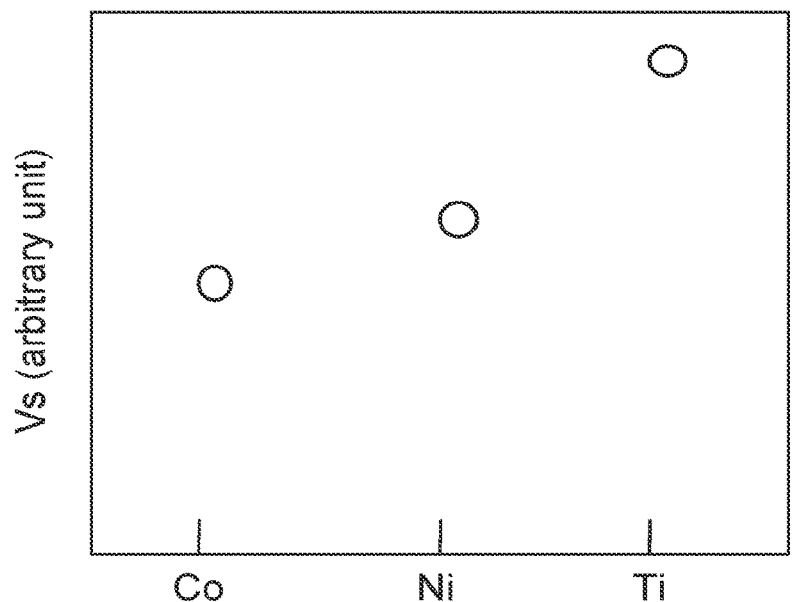
FIG. 3 is a graph showing the relationship between the material of the conductive layer and the characteristics of the memory device.

FIG. 3 is a graph showing the relationship between the material of the conductive layer and the characteristics of the memory device. FIG. 3 shows the transition voltage Vs (any unit) when each of those materials is used in the first conductive layer 1a.

As illustrated in FIG. 3, the transition voltage Vs when Ti is used is higher than the transition voltage Vs when Ni is used. Further, the transition voltage Vs when Ni is used is higher than the transition voltage Vs when Co is used. This can be considered that, for example, forming a more chemically stable structure requires higher electric energy. For example, there is a trade-off between stability of the low-resistance state and low operating voltage (transition voltage). The material used in the first conductive layer 1a may be varied depending on whether stability is viewed as important or low power consumption at a constant operating voltage is viewed as important in a product.

The thickness of the first insulating layer 2a is preferably not less than 1 nanometer (nm) and not more than 10 nm. If the thickness of the first insulating layer 2a is less than 1 nm, the first insulating layer 2a may become a discontinuous film and the device may no longer function. If the first insulating layer 2a is thicker than 10 nm, the voltage for forming a conductive filament may become too high. From the perspective of operating voltage, the thickness of the first insulating layer 2a is preferably not more than 5 nm.

The thickness of the first silicon-including layer 3a is preferably not less than 1 nm and not more than 10 nm. If the thickness of the first silicon-including layer 3a is less than 1 nm, the first silicon-including layer 3a may become a discontinuous film and the device may no longer function. If the thickness of the first silicon-including layer 3a is more than 10 nm, the voltage for forming a conductive filament may become too high. From the perspectives of operating voltage and retention characteristics, the thickness of the first silicon-including layer 3a is preferably not more than 3 nm. By forming the layers in the thicknesses described above, not only can a conductive filament made of Ni or the like be formed at a lower voltage, but a structurally stable filament can be formed. As a result, retention characteristics can be further improved.

As described above, in the embodiment, the first conductive layer 1a includes a first metal including at least one selected from a group consisting of Ni, Co, and Ti. Because the bond between such a first metal and Si included in the first silicon-including layer 3a is chemically stable, the memory state can be maintained for a long period. Additionally, the Si film, Si oxide film, and Si oxynitride film used as the first silicon-including layer 3a have high electrical resistance when no conductive filaments have been formed therein. This allows the ratio between electrical resistance in the ON state and electrical resistance in the OFF state to be large.

For example, a method of forming a one-time memory with transistors used for memory cells may also be considered. However, in such a one-time memory formed with transistors, the footprint per bit is large because a transistor is a three-terminal device. For this reason, such a one-time memory does not lend itself toward increasing the memory capacity per chip. In contrast, in the embodiment, the footprint per bit can be decreased because the stacked body 10 is a two-terminal memory cell. Furthermore, the memory capacity per chip can also be increased because the stacked bodies 10 can be three-dimensionally stacked.

The use of electrical short circuit of the insulating film as a cross-point one-time memory may be considered, for example. However, such a memory requires high power to operate. In contrast, in the embodiment, the first insulating layer 2a is formed between the first conductive layer 1a and the first silicon-including layer 3a. During the read operation, conductive filaments are not formed in the first insulating layers 2a of cells other than a cell of interest. As a result, a leakage current can be suppressed. Therefore, power consumption can be reduced. According to the embodiment, a one-time memory having a large memory capacity per chip and low power consumption can be provided.

Second Embodiment

Figure 4:
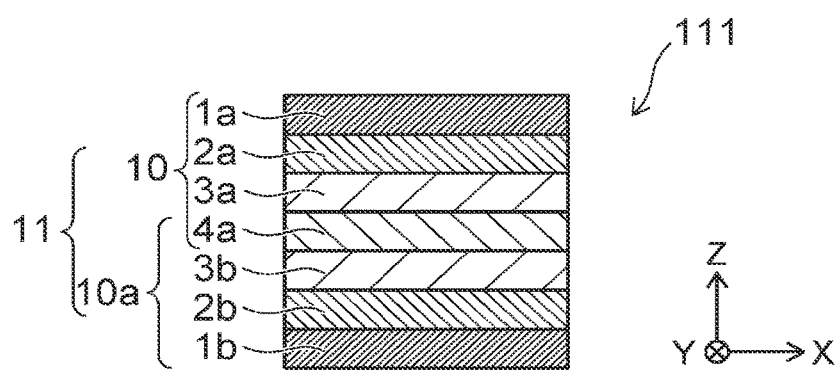
FIG. 4 is a schematic cross-sectional view showing a memory device according to a second embodiment.

FIG. 4 is a schematic cross-sectional view illustrating a memory device according to a second embodiment.

As illustrated in FIG. 4, a memory device 111 according to this embodiment includes a stacked body 11. The stacked body 11, in addition to the stacked body 10 described above, further includes a third conductive layer 1b, a second insulating layer 2b, and a second silicon-including layer 3b (a second layer).

The same materials and configuration as the first conductive layer 1a may be used in the third conductive layer 1b.

The second conductive layer 4a is provided between the first conductive layer 1a and the third conductive layer 1b. The second insulating layer 2b is provided between the second conductive layer 4a and the third conductive layer 1b. The second insulating layer 2b comes into contact with and is electrically connected to the third conductive layer 1b. The same materials and configuration as the first insulating layer 2a may be used in the second insulating layer 2b.

The second silicon-including layer 3b is provided between the second conductive layer 4a and the second insulating layer 2b. The second silicon-including layer 3b comes into contact with and is electrically connected to both of the second conductive layer 4a and the second insulating layer 2b.

The third conductive layer 1b, the second insulating layer 2b, the second silicon-including layer 3b, and the second conductive layer 4a form a stacked body 10a. The stacked body 10a functions as one memory cell, similar to the stacked body 10 described in the first embodiment.

Thus, this embodiment is a memory device in which a plurality of memory cells are stacked. Similar to the first embodiment, power consumption can be reduced in this embodiment as well. Furthermore, the stacked body 10 and the stacked body 10a share the second conductive layer 4a. This enables a high degree of integration. Sharing the second conductive layer 4a leads to a simpler configuration, thereby allowing the number of processes to be reduced and productivity to be improved.

Third Embodiment

Figure 5:
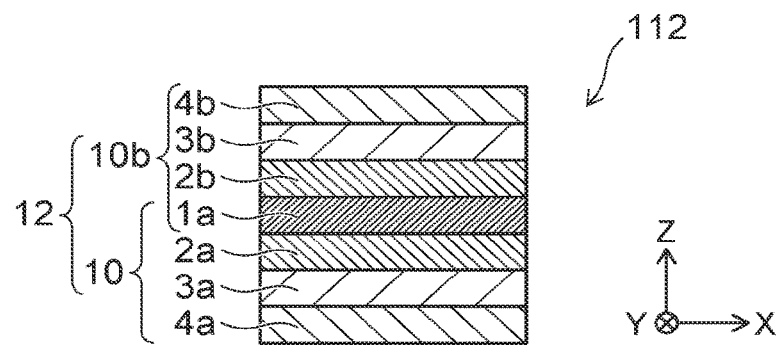
FIG. 5 is a schematic cross-sectional view showing a memory device according to a third embodiment.

FIG. 5 is a schematic cross-sectional view illustrating a memory device according to a third embodiment.

As illustrated in FIG. 5, a memory device 112 according to this embodiment includes a stacked body 12. The stacked body 12, in addition to the stacked body 10 described above, further includes a second insulating layer 2b, a second silicon-including layer 3b, and a third conductive layer 4b.

The same materials and configuration as the second conductive layer 4a may be used in the third conductive layer 4b.

The first conductive layer 1a is provided between the second conductive layer 4a and the third conductive layer 4b. The second silicon-including layer 3b is provided between the first conductive layer 1a and the third conductive layer 4b. The second silicon-including layer 3b comes into contact with and is electrically connected to the third conductive layer 4b. The same materials and configuration as the first silicon-including layer 3a may be used in the second silicon-including layer 3b.

The second insulating layer 2b is provided between the first conductive layer 1a and the second silicon-including layer 3b. The second insulating layer comes into contact with and is electrically connected to both of the first conductive layer 1a and the second silicon-including layer 3b. The same materials and configuration as the first insulating layer 2a may be used in the second insulating layer 2b.

The first conductive layer 1a, the second insulating layer 2b, the second silicon-including layer 3b, and the third conductive layer 4b form a stacked body 10b. The stacked body 10b functions as one memory cell, similar to the stacked body 10.

Similar to the first embodiment, power consumption can be reduced in this embodiment as well. Furthermore, the stacked body 10 and the stacked body 10b share the first conductive layer 1a. This enables a high degree of integration and improved productivity.

Fourth Embodiment

Figure 6:
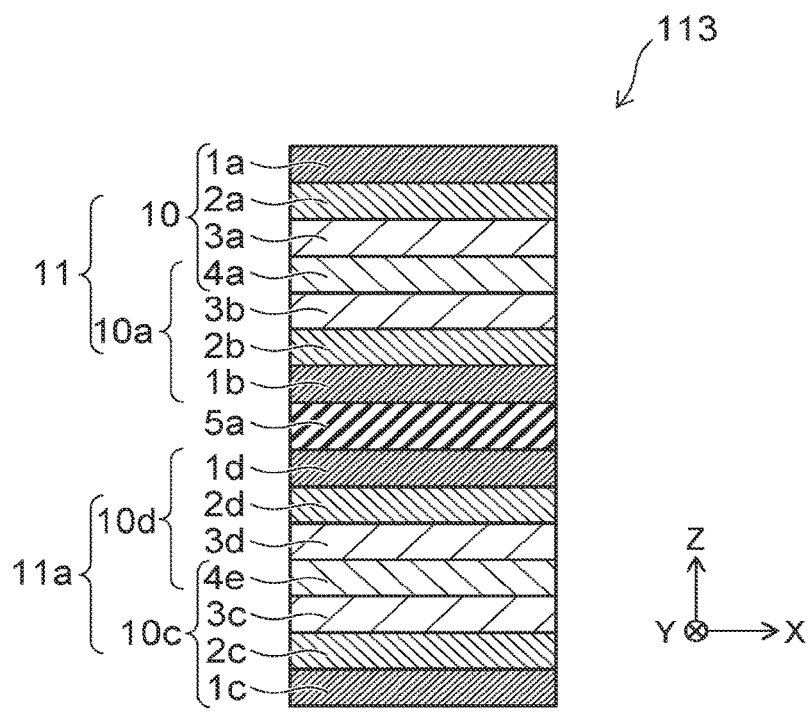
FIG. 6 is a schematic cross-sectional view showing a memory device according to a fourth embodiment.

FIG. 6 is a schematic cross-sectional view illustrating a memory device according to a fourth embodiment.

As illustrated in FIG. 6, a memory device 113 according to this embodiment includes, in addition to the stacked body 11, an interlayer insulating film 5a and a stacked body 11a. The stacked body 11 and the stacked body 11a are stacked with the interlayer insulating film 5a disposed therebetween. The same materials and configuration as the stacked body 11 may be used in the stacked body 11a.

Specifically, the stacked body 11a includes a fourth conductive layer 1c, a third insulating layer 2c, a third silicon-including layer 3c (a third layer), a fifth conductive layer 4e, a fourth silicon-including layer 3d (a fourth layer), a fourth insulating layer 2d, and a sixth conductive layer 1d.

The third conductive layer 1b is provided between the first conductive layer 1a and the fourth conductive layer 1c. The third insulating layer 2c is provided between the third conductive layer 1b and the fourth conductive layer 1c. The third silicon-including layer 3c is provided between the third conductive layer 1b and the third insulating layer 2c. The fifth conductive layer 4e is provided between the third conductive layer 1b and the third silicon-including layer 3c. The fourth silicon-including layer 3d is provided between the third conductive layer 1b and the fifth conductive layer 4e. The fourth insulating layer 2d is provided between the third conductive layer 1b and the fourth silicon-including layer 3d. The sixth conductive layer 1d is provided between the third conductive layer 1b and the fourth insulating layer 2d. The interlayer insulating film 5a is provided between the third conductive layer 1b and the sixth conductive layer 1d.

The same materials and configuration as the first conductive layer 1a may be used in the fourth conductive layer 1c and the sixth conductive layer 1d. The same materials and configuration as the first insulating layer 2a may be used in the third insulating layer 2c and the fourth insulating layer 2d. The same materials and configuration as the first silicon-including layer 3a may be used in the third silicon-including layer 3c and the fourth silicon-including layer 3d.

A silicon oxide film having a thickness of, for example, approximately not less than 20 nm and not more than 100 nm is used in the interlayer insulating film 5a.

The fourth conductive layer 1c, the third insulating layer 2c, the third silicon-including layer 3c, and the fifth conductive layer 4e form a stacked body 10c. The sixth conductive layer 1d, the fourth insulating layer 2d, the fourth silicon-including layer 3d, and the fifth conductive layer 4e form a stacked body 10d. The stacked body 10c and the stacked body 10d share the fifth conductive layer 4e. As with the stacked body 10, the stacked body 10c and the stacked body 10d each function as a memory cell.

Thus, stacking a plurality of memory cells with the interlayer insulating film 5a disposed therebetween allows the memory device to be more highly integrated.

Fifth Embodiment

Figure 7:
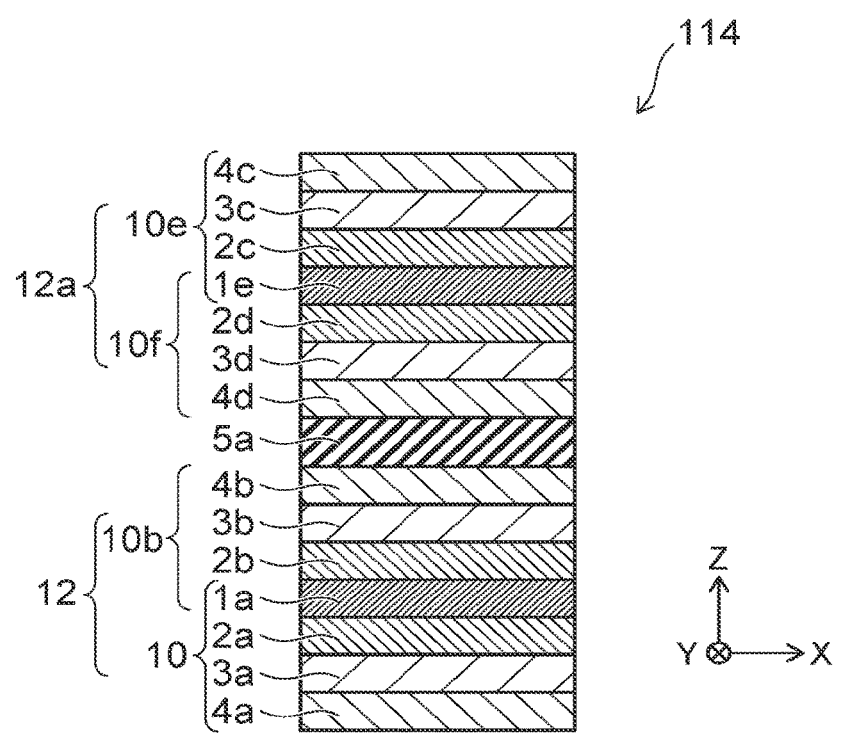
FIG. 7 is a schematic cross-sectional view showing a memory device according to a fifth embodiment.

FIG. 7 is a schematic cross-sectional view illustrating a memory device according to a fifth embodiment.

As illustrated in FIG. 7, a memory device 114 according to this embodiment includes, in addition to the stacked body 12, an interlayer insulating film 5a and a stacked body 12a. The stacked body 12 and the stacked body 12a are stacked with the interlayer insulating film 5a disposed therebetween. The same materials and configuration as the stacked body 12 may be used in the stacked body 12a.

Specifically, the stacked body 12a includes a fourth conductive layer 4c, a third silicon-including layer 3c, a third insulating layer 2c, a fifth conductive layer 1e, a fourth insulating layer 2d, a fourth silicon-including layer 3d, and a sixth conductive layer 4d.

The third conductive layer 4b is provided between the second conductive layer 4a and the fourth conductive layer 4c. The third silicon-including layer 3c is provided between the third conductive layer 4b and the fourth conductive layer 4c. The third insulating layer 2c is provided between the third conductive layer 4b and the third silicon-including layer 3c. The fifth conductive layer 1e is provided between the third conductive layer 4b and the third insulating layer 2c. The fourth insulating layer 2d is provided between the third conductive layer 4b and the fifth conductive layer 1e. The fourth silicon-including layer 3d is provided between the third conductive layer 4b and the fourth insulating layer 2d. The sixth conductive layer 4d is provided between the third conductive layer 4b and the fourth silicon-including layer 3d. The interlayer insulating film 5a is provided between the third conductive layer 4b and the sixth conductive layer 4d.

The same materials and configuration as the second conductive layer 4a may be used in the fourth conductive layer 4c and the sixth conductive layer 4d. The same materials and configuration as the first silicon-including layer 3a may be used in the third silicon-including layer 3c and the fourth silicon-including layer 3d. The same materials and configuration as the first insulating layer 2a may be used in the third insulating layer 2c and the fourth insulating layer 2d. The same materials and configuration as the first conductive layer 1a may be used in the fifth conductive layer 1e.

The fifth conductive layer 1e, the third insulating layer 2c, the third silicon-including layer 3c, and the fourth conductive layer 4c form a stacked body 10e. The fifth conductive layer 1e, the fourth insulating layer 2d, the fourth silicon-including layer 3d, and the sixth conductive layer 4d form a stacked body 10f. The stacked body 10e and the stacked body 10f share the fifth conductive layer 1e. As with the stacked body 10, the stacked body 10e and the stacked body 10f each function as a memory cell.

Thus, stacking a plurality of memory cells with the interlayer insulating film 5a disposed therebetween allows the memory device to be more highly integrated.

Sixth Embodiment

The memory device according to this embodiment is a cross-point memory. The stacked body 10 and variations thereof described in regard to the first embodiment are used in the memory device according to this embodiment.

Figure 8A:
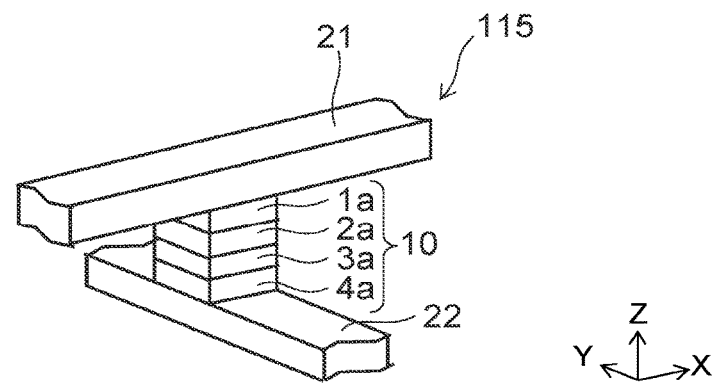
FIG. 8A to FIG. 8C are schematic perspective views showing a memory device according to a sixth embodiment.
Figure 8B:
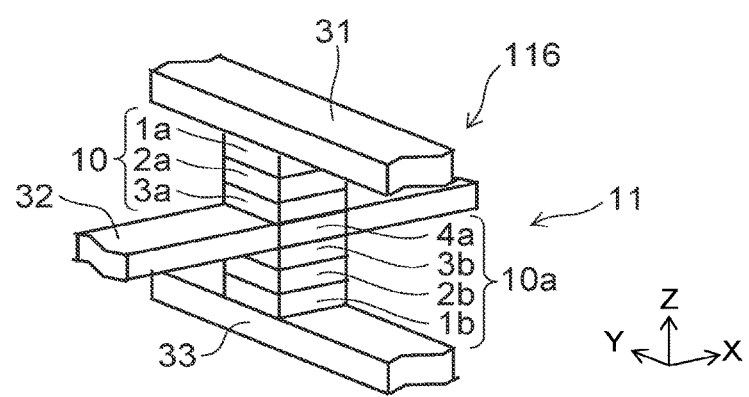
Figure 8C:
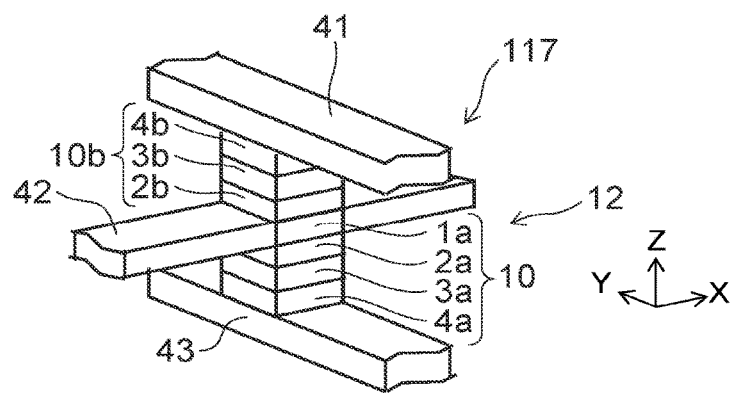

FIGS. 8A to 8C are schematic perspective views illustrating a memory device according to a sixth embodiment.

As illustrated in FIG. 8A, a memory device 115 according to this embodiment includes a wiring layer 21, a wiring layer 22, and the stacked body 10.

The stacked body 10 (at least the first insulating layer 2a and the first silicon-including layer 3a) is provided between the wiring layer 21 and the wiring layer 22.

The first conductive layer 1a of the stacked body 10 is electrically connected to the wiring layer 21, for example, by coming into contact with the wiring layer 21. The first conductive layer 1a may be a portion of the wiring layer 21.

The second conductive layer 4a of the stacked body 10 is electrically connected to the wiring layer 22, for example, by coming into contact with the wiring layer 22. The second conductive layer 4a may be a portion of the wiring layer 22.

The wiring layer 21 extends in a first direction (the X-axis direction in this example) that crosses the Z-axis direction. The wiring layer 22 extends in a second direction (the Y-axis direction in this example) that crosses the X-axis direction and the Z-axis direction. The material used in the wiring layer 21 and the wiring layer 22 is, for example, tungsten (W).

When the write operation is performed on the stacked body 10, a voltage V1 positive relative to the wiring layer 22 is applied to the wiring layer 21. Accordingly, the voltage V1 positive relative to the second conductive layer 4a is applied to the first conductive layer 1a. As a result, the stacked body 10 transitions from the high-resistance state to the low-resistance state.

When the memory state of the stacked body 10 is read, a voltage V2 positive relative to the wiring layer 22 is applied to the wiring layer 21. Accordingly, the voltage V2 positive relative to the second conductive layer 4a is applied to the first conductive layer 1a. As a result, the memory state can be detected from the electrical resistance of the stacked body 10.

As illustrated in FIG. 8B, a memory device 116 according to this embodiment includes a wiring layer 31, a wiring layer 32, a wiring layer 33, and the stacked body 11.

The stacked body 10 (at least the first insulating layer 2a and the first silicon-including layer 3a) is provided between the wiring layer 31 and the wiring layer 32. The stacked body 10a (at least the second insulating layer 2b and the second silicon-including layer 3b) is provided between the wiring layer 32 and the wiring layer 33.

The first conductive layer 1a is electrically connected to the wiring layer 31, for example, by coming into contact with the wiring layer 31. The first conductive layer 1a may be a portion of the wiring layer 31.

The third conductive layer 1b is electrically connected to the wiring layer 33, for example, by coming into contact with the wiring layer 33. The third conductive layer 1b may be a portion of the wiring layer 33.

The second conductive layer 4a is electrically connected to the wiring layer 32, for example, by coming into contact with the wiring layer 32. The second conductive layer 4a may be a portion of the wiring layer 32.

The wiring layer 31 extends in a first direction (the Y-axis direction in this example) that crosses the Z-axis direction. The wiring layer 32 extends in a second direction (the X-axis direction in this example) that crosses the Z-axis direction and the first direction. Furthermore, the wiring layer 33 extends in a third direction (the Y-axis direction in this example) that crosses the Z-axis direction and the second direction. The material used in the wiring layer 31, the wiring layer 32, and the wiring layer 33 is, for example, tungsten.

When the write operation is performed on the stacked body 10, a voltage V1 positive relative to the wiring layer 32 is applied to the wiring layer 31. At this time, the potential of the wiring layer 33 is set to, for example, the same potential as the wiring layer 32. When the memory state of the stacked body 10 is read, a voltage V2 positive relative to the wiring layer 32 is applied to the wiring layer 31. At this time, the potential of the wiring layer 33 is set to, for example, the same potential as the wiring layer 32.

When the write operation is performed on the stacked body 10a, a voltage V1 positive relative to the wiring layer 32 is applied to the wiring layer 33. At this time, the potential of the wiring layer 31 is set to, for example, the same potential as the wiring layer 32. When the memory state of the stacked body 10a is read, a voltage V2 positive relative to the wiring layer 32 is applied to the wiring layer 33. At this time, the potential of the wiring layer 31 is set to, for example, the same potential as the wiring layer 32.

As illustrated in FIG. 8C, a memory device 117 according to this embodiment includes a wiring layer 41, a wiring layer 42, a wiring layer 43, and the stacked body 12.

The stacked body 10b (at least the second insulating layer 2b and the second silicon-including layer 3b) is provided between the wiring layer 41 and the wiring layer 42. The stacked body 10 (at least the first insulating layer 2a and the first silicon-including layer 3a) is provided between the wiring layer 42 and the wiring layer 43.

The third conductive layer 4b is electrically connected to the wiring layer 41, for example, by coming into contact with the wiring layer 41. The third conductive layer 4b may be a portion of the wiring layer 41.

The first conductive layer 1a is electrically connected to the wiring layer 42, for example, by coming into contact with the wiring layer 42. The first conductive layer 1a may be a portion of the wiring layer 42.

The second conductive layer 4a is electrically connected to the wiring layer 43, for example, by coming into contact with the wiring layer 43. The second conductive layer 4a may be a portion of the wiring layer 43.

The wiring layer 41 extends in a first direction (the Y-axis direction in this example) that intersects the Z-axis direction. The wiring layer 42 extends in a second direction (the X-axis direction in this example) that intersects the Z-axis direction and the first direction. Furthermore, the wiring layer 43 extends in a third direction (the Y-axis direction in this example) that intersects the Z-axis direction and the second direction. The material used in the wiring layer 41, the wiring layer 42, and the wiring layer 43 is, for example, tungsten.

When the write operation is performed on the stacked body 10, a voltage V1 positive relative to the wiring layer 43 is applied to the wiring layer 42. At this time, the potential of the wiring layer 41 is set to, for example, the same potential as the wiring layer 42. When the memory state of the stacked body 10 is read, a voltage V2 positive relative to the wiring layer 43 is applied to the wiring layer 42. At this time, the potential of the wiring layer 41 is set to, for example, the same potential as the wiring layer 42.

When the write operation is performed on the stacked body 10b, a voltage V1 positive relative to the wiring layer 41 is applied to the wiring layer 42. At this time, the potential of the wiring layer 43 is set to, for example, the same potential as the wiring layer 42. When the memory state of the stacked body 10b is read, a voltage V2 positive relative to the wiring layer 41 is applied to the wiring layer 42. At this time, the potential of the wiring layer 43 is set to, for example, the same potential as the wiring layer 42.

Figure 9:
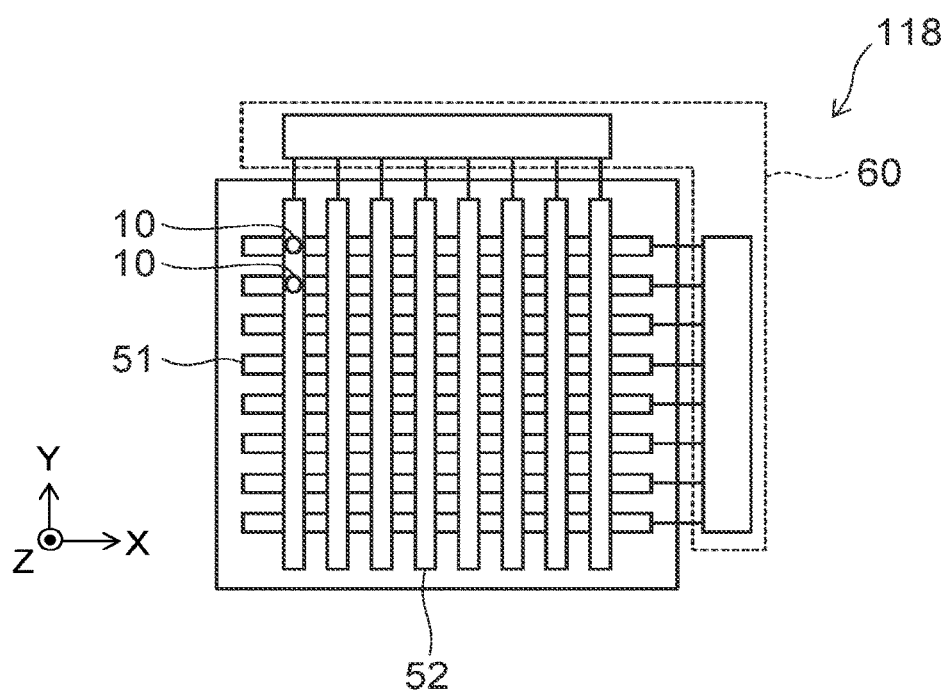
FIG. 9 is a schematic plan view showing a memory device according to the sixth embodiment.

FIG. 9 is a schematic plan view illustrating a memory device according to the sixth embodiment.

As illustrated in FIG. 9, a plurality of wires 51 and a plurality of wires 52 are provided in a memory device 118. The plurality of wires 51 are mutually parallel. The plurality of wires 52 are mutually parallel. The extending direction of the wires 51 intersects the extending direction of the wires 52. In the wires 51, for example, the wiring layer 21 is used. In the wires 52, for example, the wiring layer 22 is used. The wires 51 are used as, for example, word lines. The wires 52 are used as, for example, bit lines.

A plurality of stacked bodies 10 are each provided at each of the intersections of the plurality of wires 51 with the plurality of wires 52. The wires 51 and the wires 52 are connected to a controller 60 (control circuit). The wires 51 and the wires 52 cause one selected from the plurality of stacked bodies 10 to be put in a selected state, and a desired operation (e.g., the write operation or the read operation) is performed. That is, for example, the controller 60 applies the first potential (the voltage V1) to the first conductive layer 1a to change electrical resistance between the second conductive layer 4a and the first conductive layer 1a from a high-resistance state to a low-resistance state. The first potential is positive relative to the second conductive layer 4a. For example, the controller 60 applies a second potential (the voltage V2) to the first conductive layer 1a to detect the electrical resistance between the second conductive layer 4a and the first conductive layer 1a. The second potential is positive relative to the second conductive layer 4a and an absolute value of the second potential is smaller than an absolute value of the first potential. The memory device 118 is a cross-point resistive random access memory.

Additionally, the stacked body 10a or the stacked body 10b may be stacked on each of the plurality of stacked bodies 10, similar to FIGS. 8B and 8C. In other words, the embodiment may be used in a cross-point memory having a three-dimensionally stacked structure. This enables a higher degree of integration.

The memory devices 111-118 are one of non-volatile memory devices, for example.

According to the embodiment, a memory device with low power consumption can be provided.

It should be noted herein that "electrically connected" is used to mean not only a connection by direct contact, but also a connection via another conductive member or the like.

It should be note that "perpendicular" and "parallel" are used to mean not only perpendicular and parallel in their narrowest sense, but also substantially perpendicular and parallel so as to take factors into account such as variations in manufacturing processes and the like.

Thus far, embodiments of the invention have been described with reference to examples. However, the embodiments of the invention are not limited to these examples. The specific configurations of the elements such as conductive layers, insulating layers, wiring, and controllers included in the memory device are not limited. Where a person skilled in the art selects the specific configurations of such elements from well-known technologies and implements the invention in a similar manner, provided that similar effects are achieved, the result shall be understood to be included within the scope of the invention.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
   a first conductive layer comprising a first metal comprising at least one selected from the group consisting of nickel and cobalt;
   a second conductive layer comprising at least one selected from a group consisting of tungsten, molybdenum, platinum, tungsten nitride, molybdenum nitride, titanium nitride, tantalum and tantalum nitride;
   a first insulating layer provided between the first conductive layer and the second conductive layer and having a thickness of 1 nm to 10 nm; and
   a first layer provided between the first insulating layer and the second conductive layer,
   wherein
   the first layer comprises silicon,
   the first layer includes a first region and a second region, the second region being positioned between the first region and the second conductive layer,
   a first concentration of the first metal in the first region is higher than a second concentration of the first metal in the second region, and
   the first metal is present in the first insulating layer, and the concentration of the first metal in the first insulating layer is lower than the first concentration.

2. The device according to claim 1, wherein the first conductive layer comprises a compound of the first metal and silicon.

3. The device according to claim 1, wherein the first layer comprises at least one selected from a group consisting of silicon, silicon oxide, silicon nitride, and silicon oxynitride.

4. The device according to claim 1, wherein the first insulating layer comprises at least one selected from a group consisting of hafnium oxide, zirconium oxide, titanium oxide and a combination thereof.

5. The device according to claim 1, further comprising:
a first wiring layer extending in a first direction; and
a second wiring layer extending in a second direction,
wherein
the first direction crosses a third direction from the second conductive layer toward the first conductive layer,
the second direction crosses the third direction,
the first conductive layer is electrically connected to the first wiring layer, and
the second conductive layer is electrically connected to the second wiring layer.

6. The device according to claim 5, wherein
the first wiring layer comprises tungsten, and
the second wiring layer comprises tungsten.

7. The device according to claim 1, further comprising:
a third conductive layer comprising the first metal, the second conductive layer provided between the first conductive layer and the third conductive layer;
a second insulating layer provided between the second conductive layer and the third conductive layer; and
a second layer provided between the second conductive layer and the second insulating layer, wherein the second layer comprises silicon.

8. The device according to claim 7, further comprising:
a first wiring layer extending in a first direction;
a second wiring layer extending in a second direction; and
a third wiring layer extending in a third direction,
wherein
the first direction crosses a fourth direction from the second conductive layer toward the first conductive layer,
the second direction crosses the fourth direction,
the third direction crosses the fourth direction,
the first conductive layer is electrically connected to the first wiring layer,
the second conductive layer is electrically connected to the second wiring layer, and
the third conductive layer is electrically connected to the third wiring layer.

9. The device according to claim 1, further comprising:
a third conductive layer comprising at least one selected from a group consisting of tungsten, molybdenum, platinum, tungsten nitride, molybdenum nitride, titanium nitride, tantalum, and tantalum nitride;
a second layer provided between the first conductive layer and the third conductive layer, wherein the second layer comprises silicon; and
a second insulating layer provided between the first conductive layer and the second layer.

10. The device according to claim 9, further comprising:
a first wiring layer extending in a first direction;
a second wiring layer extending in a second direction; and
a third wiring layer extending in a third direction,
wherein
the first direction crosses a fourth direction from the second conductive layer toward the first conductive layer,
the second direction crosses the fourth direction,
the third direction crosses the fourth direction,
the first wiring layer is electrically connected to the third conductive layer,
the second wiring layer is electrically connected to the first conductive layer, and
the third wiring layer is electrically connected to the second conductive layer.

11. The device according to claim 7, wherein the third conductive layer comprises a compound of the first metal and silicon.

12. The device according to claim 7, wherein the second layer comprises at least one selected from a group consisting of silicon, silicon oxide, silicon nitride and silicon oxynitride.

13. The device according to claim 7, wherein the second insulating layer comprises at least one selected from a group consisting of hafnium oxide, zirconium oxide, titanium oxide, and a combination thereof.

14. The device according to claim 1, further comprising a control circuit configured to apply a first potential to the first conductive layer to change electrical resistance between the second conductive layer and the first conductive layer from a high-resistance state to a low-resistance state, wherein the first potential is positive relative to the second conductive layer.

15. The device according to claim 14, wherein
the control circuit applies a second potential to the first conductive layer to detect the electrical resistance between the second conductive layer and the first conductive layer, and
the second potential is positive relative to the second conductive layer and an absolute value of the second potential is smaller than an absolute value of the first potential.

16. The device according to claim 1, wherein the first insulating layer contacts the first conductive layer.

17. The device according to claim 1, wherein the first layer contacts the first insulating layer.

18. The device according to claim 1, wherein the second conductive layer contacts the first layer.

19. The device according to claim 6, wherein
the first conductive layer contacts the first wiring layer, and
the second conductive layer contacts the second wiring layer.

20. The device according to claim 1, wherein the first metal comprises nickel.

21. The device according to claim 1, wherein the first layer comprises a conductive filament composed of the first metal and Si atoms.

22. The device according to claim 1, wherein the first layer comprises a bonding of silicon and the first metal.

* * * * *